United States Patent [19]

Escobosa et al.

[11] Patent Number: 5,537,463
[45] Date of Patent: *Jul. 16, 1996

[54] MAGNETIC MODEM IN A REMOTE CONTROL

[75] Inventors: Marcus Escobosa, Anaheim; Paul V. Darbee, Santa Ana, both of Calif.

[73] Assignee: Universal Electronics Inc., Twinsburg, Ohio

[ * ] Notice: The term of this patent shall not extend beyond the expiration date of Pat. No. 5,228,077.

[21] Appl. No.: 251,336

[22] Filed: May 31, 1994

Related U.S. Application Data

[63] Continuation-in-part of Ser. No. 134,086, Oct. 8, 1993, which is a continuation of Ser. No. 46,105, Apr. 8, 1993, Pat. No. 5,255,313, which is a continuation of Ser. No. 587,326, Sep. 24, 1990, Pat. No. 5,228,077, which is a continuation-in-part of Ser. No. 127,999, Dec. 2, 1987, Pat. No. 4,959,810, which is a continuation-in-part of Ser. No. 109,336, Oct. 14, 1987, abandoned.

[51] Int. Cl.$^6$ ........................................ H04M 11/00
[52] U.S. Cl. .................... 379/102; 379/444; 348/734
[58] Field of Search .......................... 379/102, 104–105, 379/90, 110, 443, 444, 93, 97–99; 348/734; 455/151.1–151.4, 352; 375/327, 331, 202; 340/825.69, 825.72, 825.57

[56] References Cited

U.S. PATENT DOCUMENTS

| | | | |
|---|---|---|---|
| 3,777,272 | 12/1973 | Fleccher et al. | 375/327 |
| 4,415,769 | 11/1983 | Gray | 379/443 |
| 4,601,043 | 7/1986 | Hardt et al. | 375/202 |
| 4,626,848 | 12/1986 | Ehlers | 348/734 |
| 4,727,535 | 2/1988 | Brandt . | |
| 4,807,052 | 2/1989 | Amano | 348/734 |
| 4,807,251 | 2/1989 | Shibano | 375/331 |
| 4,959,810 | 9/1990 | Darbee et al. | 455/151 |
| 5,138,649 | 8/1992 | Krisbergh et al. . | |
| 5,228,077 | 7/1993 | Darbee | 379/102 |
| 5,414,756 | 5/1995 | Levine | 379/102 |

*Primary Examiner*—Wing F. Chan
*Attorney, Agent, or Firm*—Thomas R. Vigil

[57] ABSTRACT

The remote control comprises a microprocessor including a CPU and memory, a keypad including keys for operating the remote control coupled to the microprocessor, signal outputting circuitry, driver circuitry coupled to the microprocessor for driving the signal outputting circuitry, hardware and software, including the microprocessor, for generating output signal data which is supplied to the driver circuitry, a signal coupling transducer, such as a pick-up coil, in the remote control for picking up electro-magnetic signals from an electro-magnetic signal emitting or transmitting device, such as a telephone handset, coupling circuitry for coupling the signal coupling transducer to the microprocessor and decoding software in the microprocessor for decoding the electro-magnetic signals picked up into bits and/or bytes of output signal data and storing same in the memory.

27 Claims, 8 Drawing Sheets

MAGNETIC MODEM IN A REMOTE CONTROL

CROSS REFERENCE TO RELATED APPLICATIONS

This application is a continuation-in-part of U.S., application Ser. No. 08/134,086 filed on Oct. 8, 1993, which is a continuation of U.S. application Ser. No. 08/046,105 filed on Apr. 8, 1993, now U.S. Pat. No. 5,255,313, which is a continuation of U.S. application Ser. No. 07/587,326 filed on Sep. 24, 1990, now U.S. Pat. No. 5,228,077, which is a continuation-in-part of U.S. application Ser. No. 07/127,999 filed on Dec. 2, 1987, now U.S. Pat. No. 4,959,810, which is a continuation-in-part of U.S. application Ser. No. 07/109,336 filed on Oct. 14, 1987, now abandoned.

BACKGROUND OF THE INVENTION

1. Field of the Invention

The present invention relates to a remote control for an electrical apparatus, such as a television set, that has data coupling structure for enabling data to be input into (or withdrawn from) the memory of the remote control. More specifically, the remote control includes a signal coupling transducer, such as a pick-up coil, therein for picking up electro-magnetic signals from a telephone handset or other electro-magnetic wave emitter or transmitter. A piezo-electric element is used to transmit data. The present invention also relates to a remote control system comprising the remote control and software including a software implemented Costas Loop for enabling new data and program instructions to be input into the memory of the remote control from a host computer through a telephone line, a telephone handset, or other electro-magnetic wave emitter or transmitter and the signal coupling transducer in the remote control.

2. Description of the Related Art Including Information Disclosed Under 37 CFR §§ 1.97–1.99, Heretofore a variety of remote controls have been proposed for operating televisions, VCR's and other consumer electronic equipment. Typically, such remote controls are provided with a library of function code data (typically 8 bit bytes) for generating infrared (IR) driver instructions for causing one or more light emitting diodes (LED'S) to emit a digital IR signal defined by a series of IR "light on-light off" pulses for causing a controlled device, such as a television set, to perform a desired function.

Examples of previously proposed universal remote controls having a library of function code data stored in a memory of the remote control, and some having data coupling structure for inputting data into the memory of the remote control after it leaves the factory, are disclosed in the following patent publications:

| U.S. Pat. No. | Patentee |
|---|---|
| 4,356,509 | Skerlos |
| 4,386,436 | Kocher et al. |
| 4,488,179 | Krüger |
| 4,509,211 | Robbins |
| 4,623,887 | Welles, II |
| 4,625,080 | Scott |
| 4,626,848 | Ehlers |
| 4,656,655 | Hashimoto |
| 4,703,359 | Rumbolt et al. |
| 4,718,112 | Shinoda |
| 4,746,919 | Reitmier |
| 4,774,511 | Rumbolt et al. |
| 4,825,200 | Evans et al. |
| 4,841,368 | Rumbolt et al. |
| 4,885,766 | Yasuoka et al |
| 4,899,370 | Kameo et al. |
| 4,918,439 | Wozniak et al. |
| 4,959,810 | Darbee et al. |
| 5,123,046 | Levine |
| 5,228,077 | Darbee |
| 5,255,313 | Darbee |

| Foreign Patent Publications: | |
|---|---|
| E.P. PUBLICATION NO. | APPLICANT |
| 0 309 878 | Deutsche Thomson |
| 0 354 313 | Grundig E.M.V. |
| 0 446 864 | Pioneer Electronic Corporation |

| U.K. PATENT PUB. NO. | APPLICANT |
|---|---|
| 2,053,539 | Ruppertsberg |
| 2,136,177 | Bennett et al. |
| 2,166,322 | Hashimoto |
| 2,192,743 (PCT WO 87/0614) | Sandbank |
| 2,215,928 | Rank Precision Industries Ltd. |
| 2,229,022 | Creda Limited (nonanalogous art) |
| 2,229,023 | Creda Limited (nonanalogous art) |
| 2,229,024 | Creda Limited (nonanalogous art) |

All but two of these patent publications are in English and all of them are cited as background art.

The German language E.P. Published Patent Application No. 0 309 878 teaches a method for programming tuning data into an audio or video device, in particular, a VCR. The tuning data, such as channel frequency, etc., needed for receiving television and/or radio programs can be stored in the program memory of the device by allocating a certain program number of identification therewith. The tuning data and their allocated program number are learned from a program memory of an already programmed audio visual device such as a television set.

The German language E.P. Published Patent Application No. 0 354 313 teaches the transferring of tuning data from a personal computer to an arrangement, which appears to be a remote control having infrared output, via a cable. The tuning data is related to the channels or stations that a television set is capable of receiving by cable, satellite or air waves. The arrangement or remote control can then supply the tuning data to a memory of a receiving device which can be a television set.

The non-analogous U.K. Patent Publications Nos. 2,229,022, 2,229,023 and 2,229,024 teach a system for control of home appliances such as lamps, heaters and heat sensors with an IR handset that communicates via an infra-red or other electro-magnetic or acoustic link with a terminal which transmits a mains borne data packet to another terminal, such as a bus controller terminal. An electrical appliance, such as a lamp or a heater, is controlled by the mains borne data packets sent by the controller. The system has a modem link to the telephone system and the IR handset also has a telephone modem so that a single handset can control the appliances within the household via the electro-magnetic or acoustic link or out of the household via the telephone link.

SUMMARY OF THE INVENTION

The signal coupling system or modem system utilized in the remote control of the present invention is a low cost modem system that will allow customizing of a customer's remote control by telephone or other electro-magnetic wave transmitter. The parts cost for the modem capabilities utilizing a DSP/PSK approach is very low and the modem system can be made completely automatic, completely manual or a combination of both.

In the automatic configuration, a customer can specify the desired modes and devices using menu displays on the remote. Once the customers requests are complete, the remote will, for example, instruct the customer to take the phone off the hook, and place it on or hold it on to the remote. The remote control can then initiate a call to the vendor or manufacturer of the remote control using touch tone dialing with an internal speaker/buzzer in the remote control. Once connected, the remote control software can ask for the configuration information that the customer specified from the menu displayed on his/her remote control. As the data transfer occurs, the remote control will inform the customer of the progress so that the customer doesn't wonder what is happening and hang up the telephone handset. Text information such as TV manufacturer and model number can be entered using the keypad. A keypad arrangement (like that on a telephone) that includes the alphabet can be used to spell out names like "Mitsubishi".

For remote controls without a display, the customer will call the vendor's or manufacturer's telephone number directly. An operator can then enter information about devices, manufactures, and model numbers to prepare a file for downloading to the remote control. Once the information has been taken down, the operator will instruct the customer to press a button sequence on the remote control, and to hold the remote control against the telephone. If desired, the remote control can be programmed or arranged to cause an LED to blink or a speaker to beep a sound to indicate that downloading is complete.

Combination of automatic and manual operating can occur also. The vendor's or manufacturer's telephone help number can be automated using a voice menuing system, and the customer can interact with it by pressing numbers on a touch tone phone. A panic/frustration key (maybe the * key) can be used to call the vendor's or manufacturer's operator for assistance.

However, the system is designed to interact with the customer. The voice mail menuing system modem technology that the vendor or manufacturer uses for communicating with the customer uses Digital Signal Processing (DSP for downloading to the remote controls) and, for example, the Multi-Media capabilities of Microsoft's Windows operating system (for processing a call from a customer in the "Host" system of the vendor or manufacturer).

Thus, according to the present invention there is provided a remote control comprising a microprocessor including a CPU and memory, a keypad including keys for operating the remote control coupled to the microprocessor, signal outputting circuitry, driver circuitry coupled to the microprocessor for driving the signal outputting circuitry, hardware and software, including the microprocessor, for generating output signal data which is supplied to the driver circuitry, a signal coupling transducer, such as a pickup coil, in the remote control for picking up electro-magnetic signals from a device capable of emitting electro-magnetic signals, e.g., a telephone handset, coupling circuitry for coupling the signal coupling transducer to the microprocessor and decoding software in the microprocessor for decoding the electro-magnetic signals picked up into bits and/or bytes of output signal data and storing same in the memory.

Figure 1:
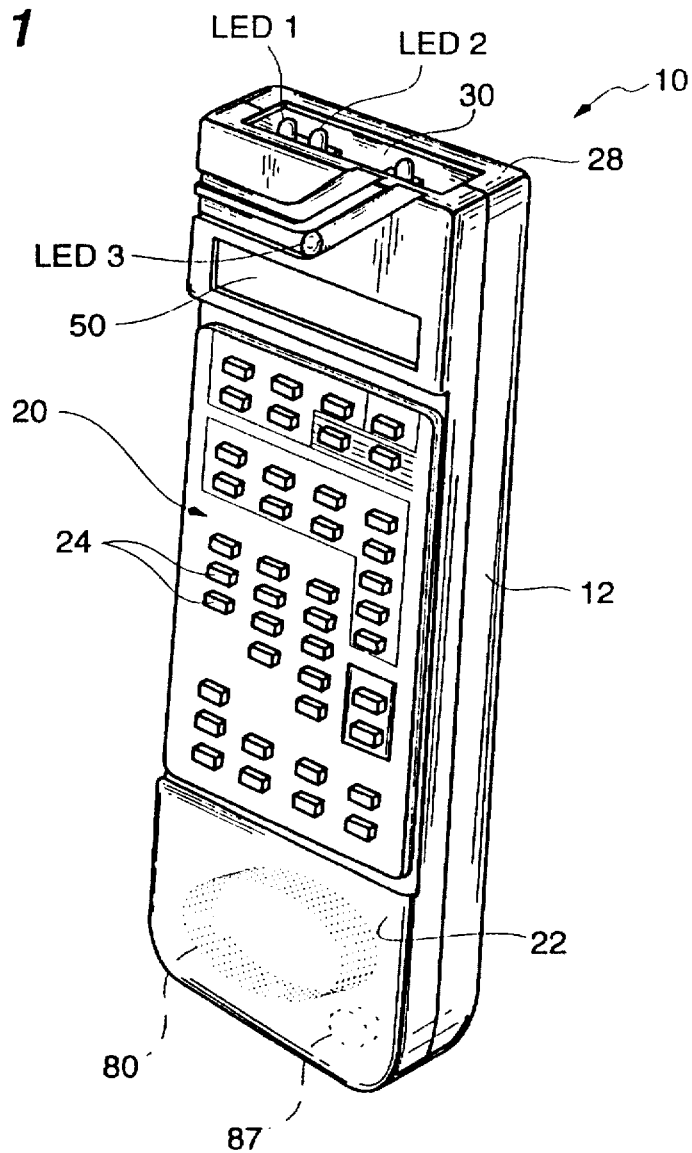
FIG. 1 is a top perspective view of one embodiment of a remote control constructed according to the teachings of the present invention.

FIG'S. 2A and 2B are an electrical schematic circuit diagram of the electrical circuit of the remote control shown in FIG. 1.

Figure 3:
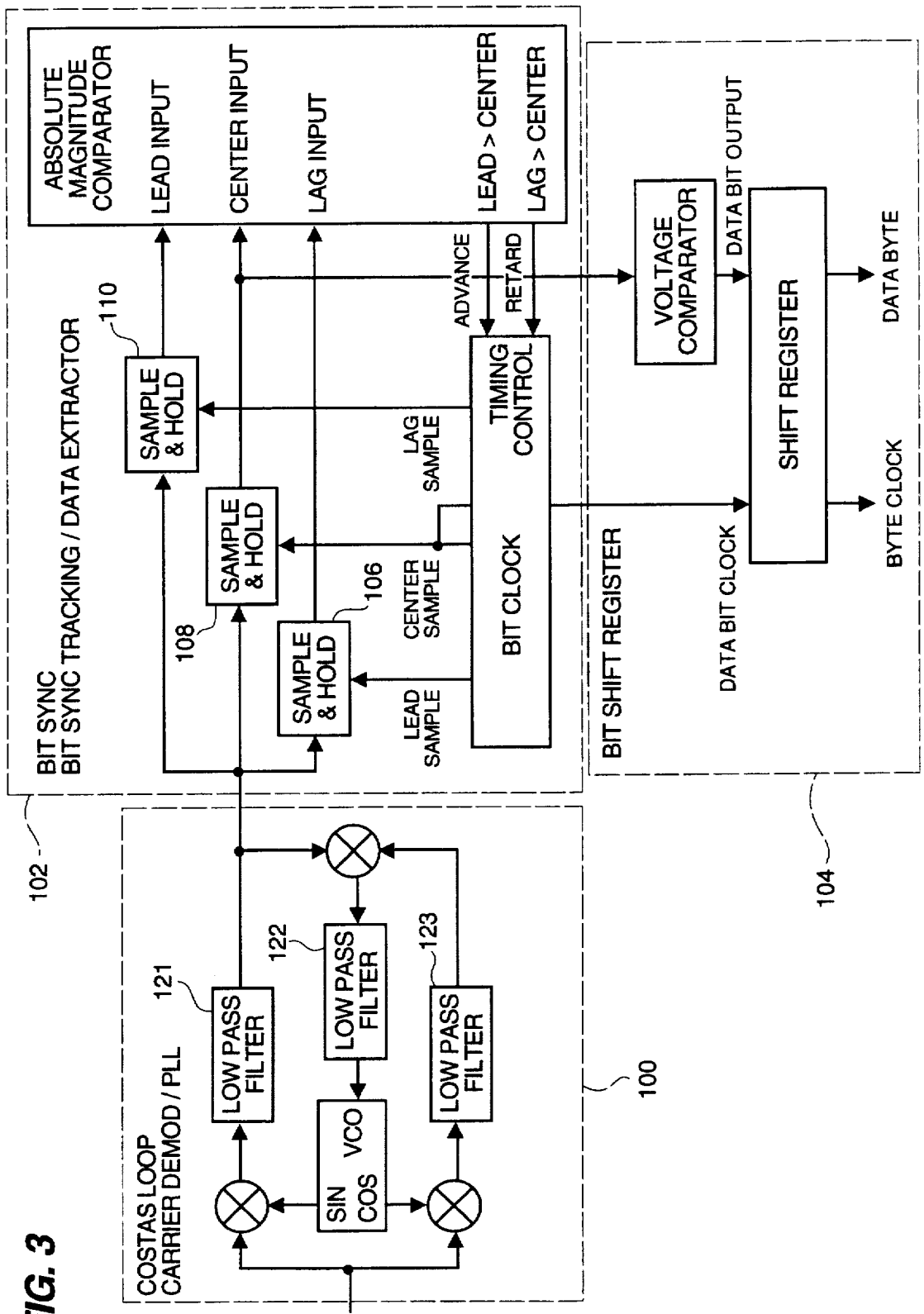

FIG. 3 is an electrical equivalent function block diagram of decoding software including a Costas Loop section, a Bit Sync section and a Bit Shift Register section.

Figure 4:
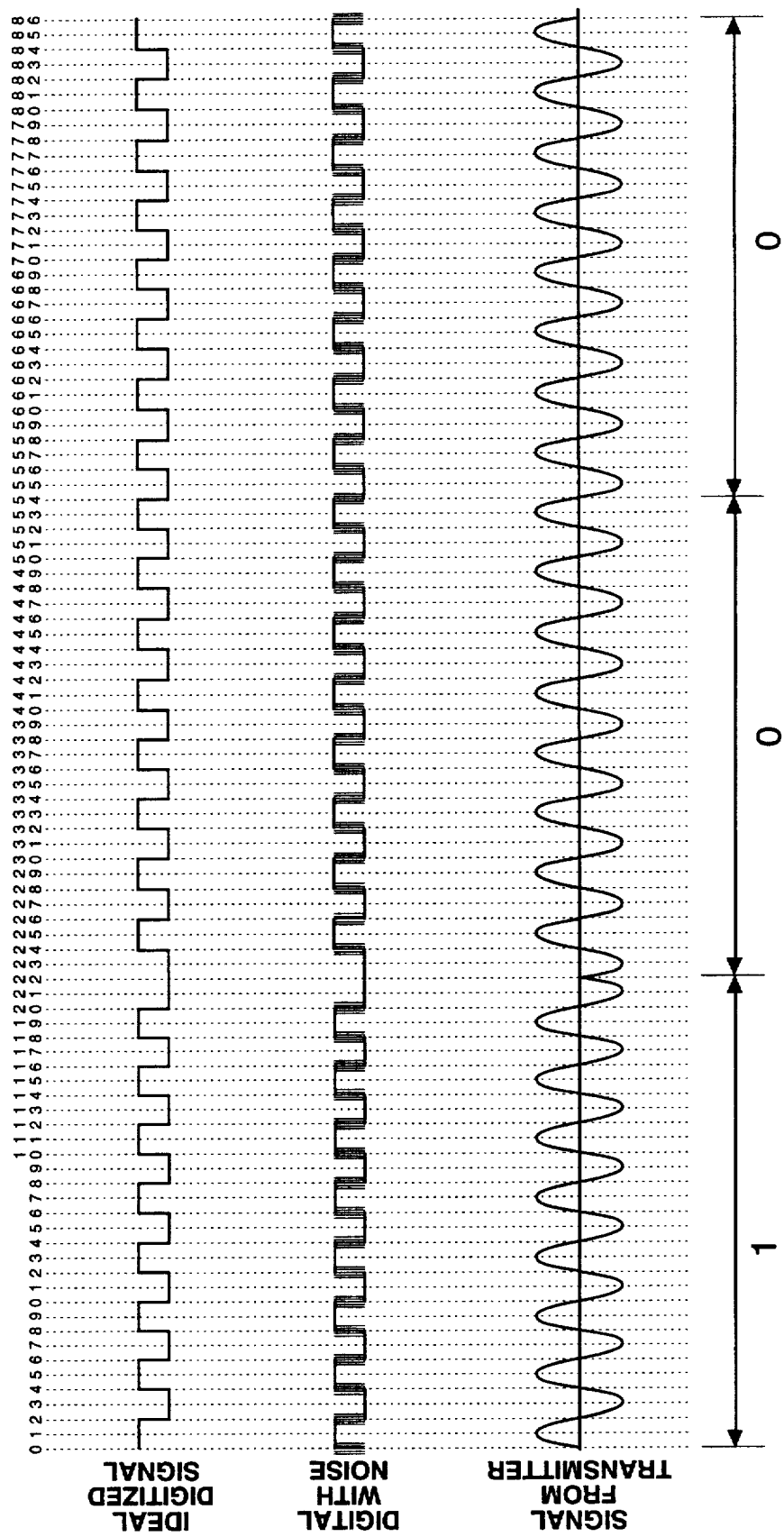

FIG. 4 is a set of three graphs of an ideal digitized signal, an ideal digitized signal with noise and an actual signal from a transmitter showing the phase shifting between two sets of eight cycles which define, respectively, a data bit 1 and a data bit 0.

Figure 5:
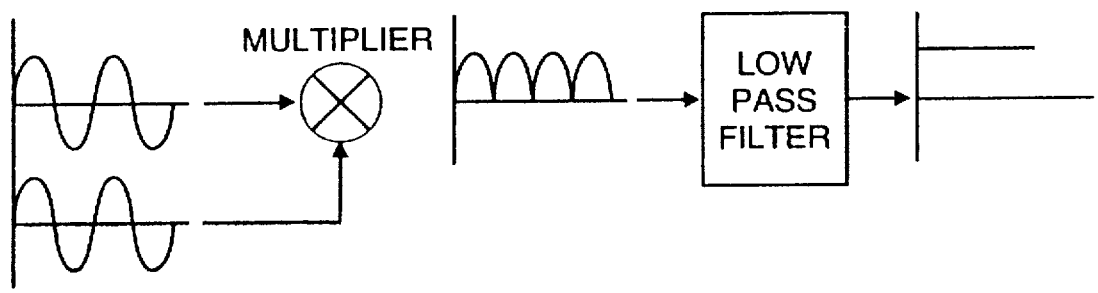

FIG. 5 is an example of a block circuit diagram of an inphase multiplier circuit.

Figure 6:
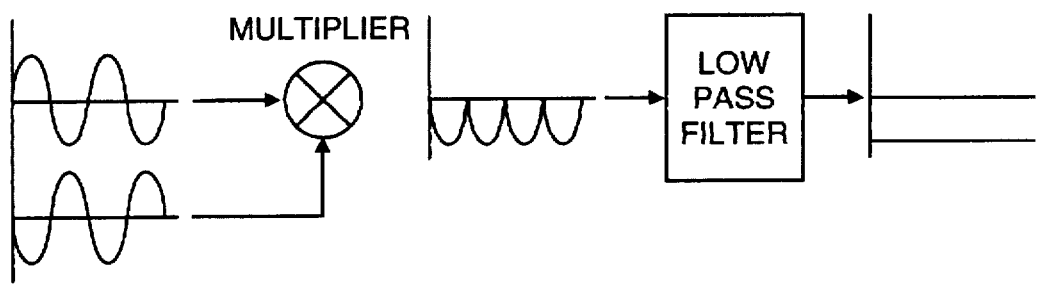

FIG. 6 is an example of a waveform and block circuit diagram of a 180 degree multiplier circuit.

Figure 7:
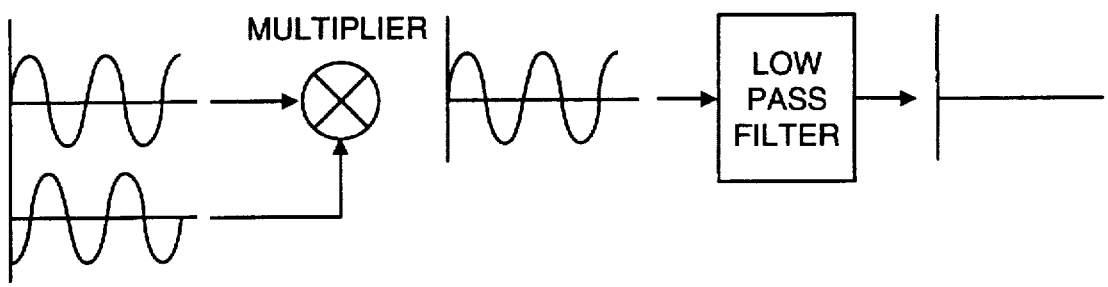

FIG. 7 is an example of a waveform and block circuit diagram of a two waves in quadrature multiplier circuit.

Figure 8:
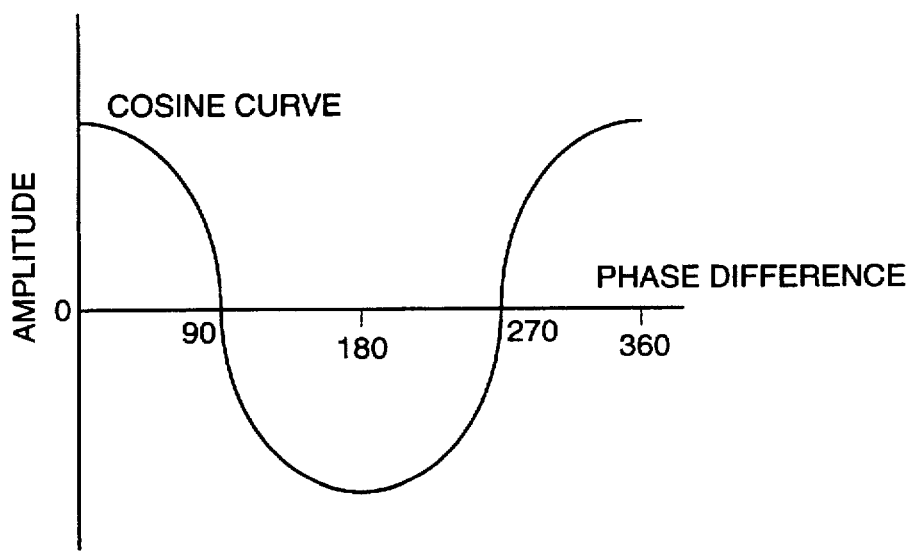

FIG. 8 is a graph of phase difference versus amplitude of the multiplication of sine waves having phase differences.

Figure 9:
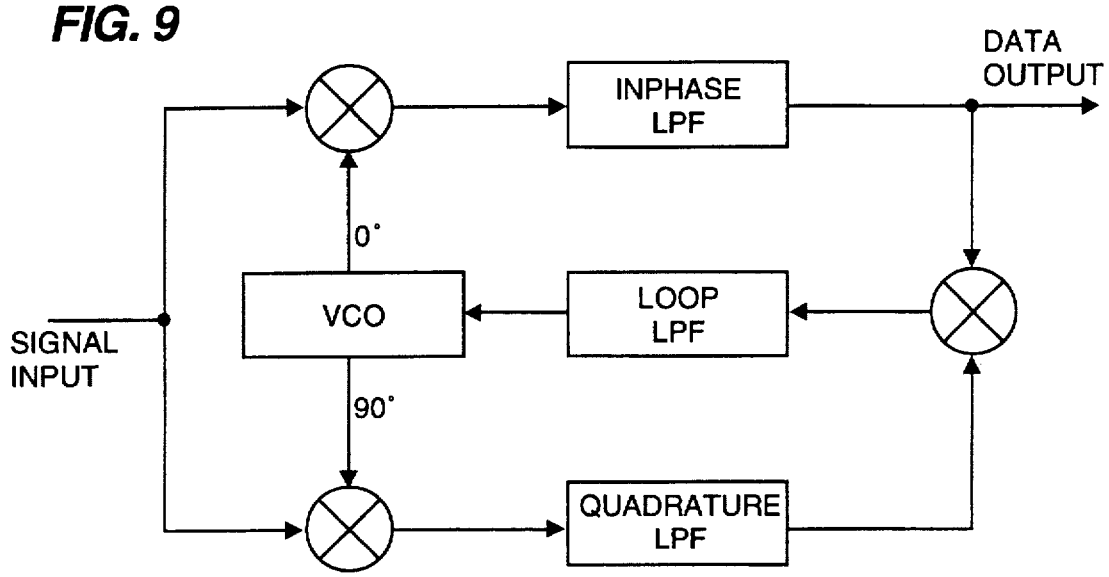

FIG. 9 is a Costas Loop diagram.

Figure 10:
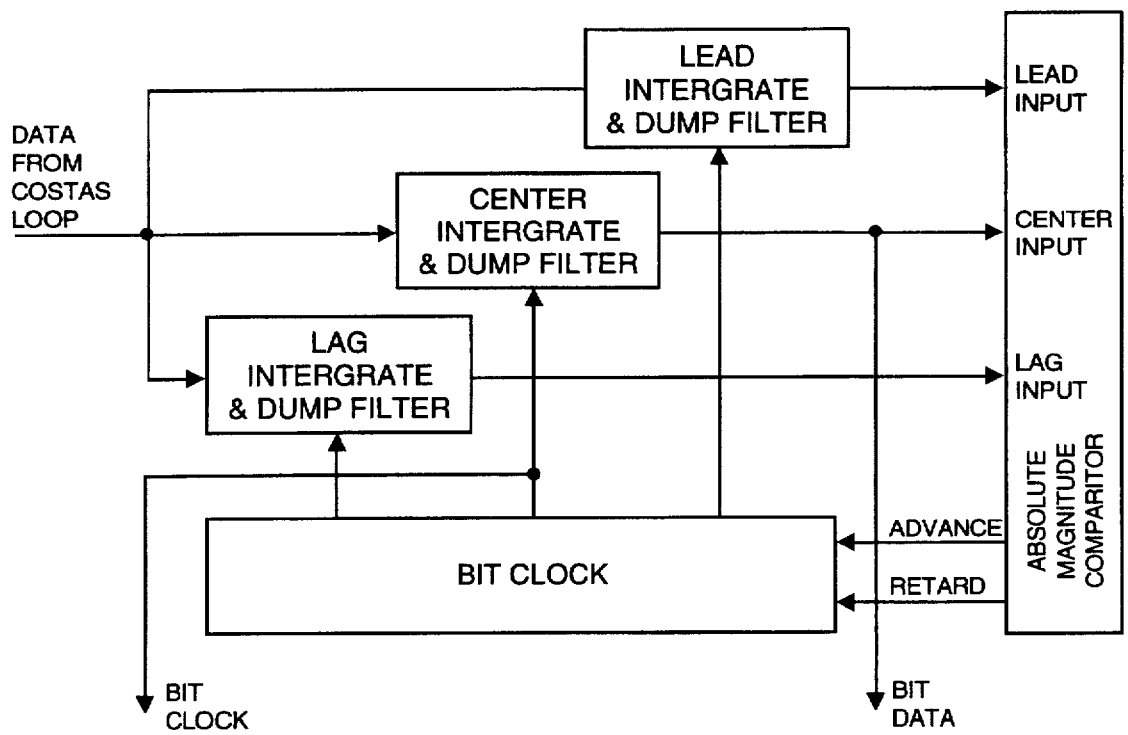

FIG. 10 is a Bit Sync diagram.

Figure 11:
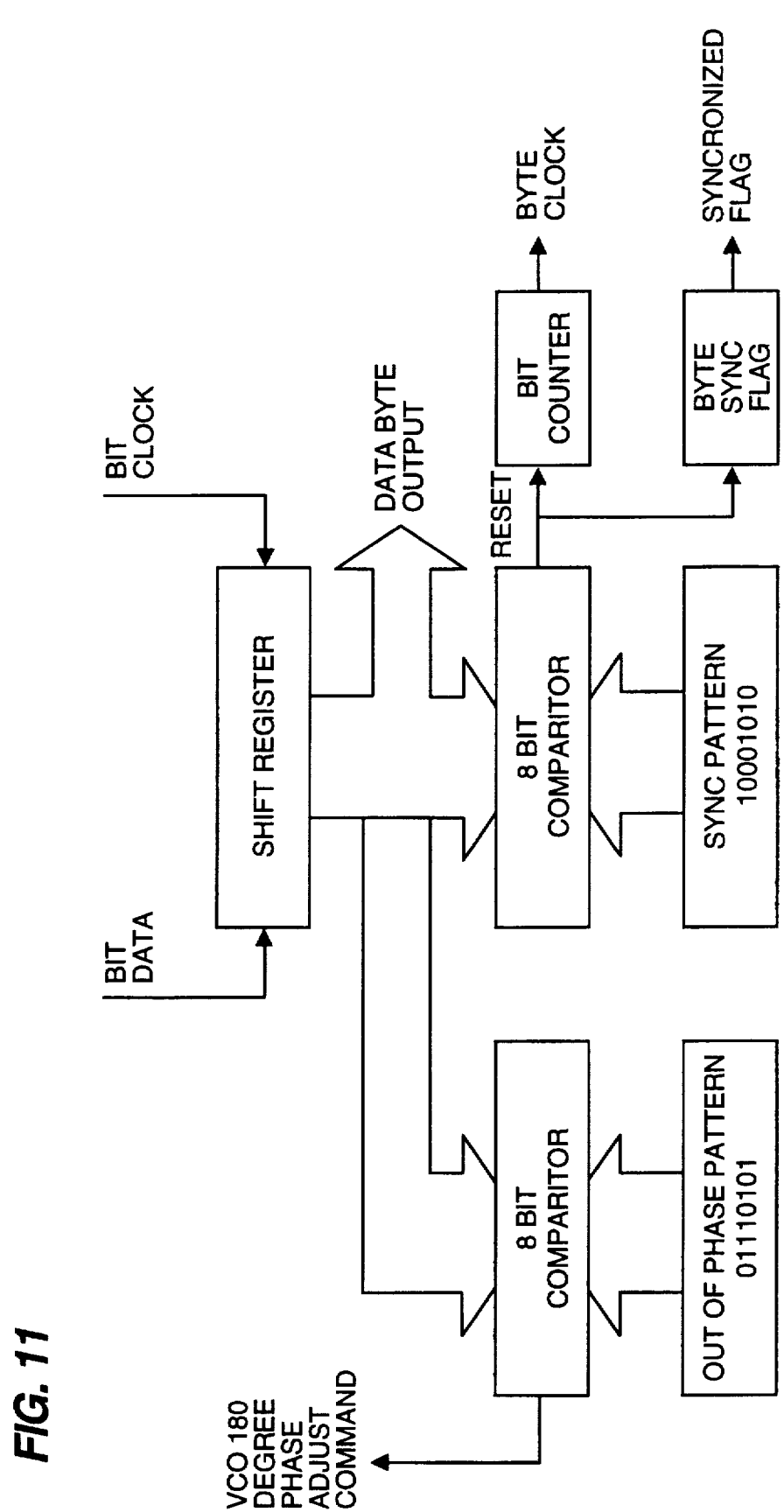

FIG. 11 is a Byte (Frame) Synchronization block diagram.

DESCRIPTION OF THE PREFERRED EMBODIMENT(S)

Referring now to FIG. 1 in greater detail, there is illustrated therein a remote control 10 constructed according to the teachings of the present invention.

As shown, the remote control 10 includes a housing 12 having a keyboard layout, i.e. a keypad 20, on an upper surface 22 thereof.

Elastomeric pushbuttons or keys 24 of the keypad 20 are arranged in rows and columns as shown.

At a top or forward end 28 of the remote control 10 there is provided an opening or window 30 for at least one, and in this embodiment two infra-red light emitting diode, LED 1 and LED 2. Also, on the upper surface 22 of the housing 12 of the remote control 10, there is provided another light emitting diode, LED 3, by which information can be communicated to a user of the remote control 10. Alternatively, a visual display, (such as the LCD display 50 shown in FIG. 1), can be provided for communicating information to a user of the remote control 10. In one embodiment of the remote control 10, LED 3 is caused to blink (or a buzzer is caused to emit a sound) to indicate to a user that a data transmission has been completed.

The infra-red light emitting diodes LED 1 and LED 2 are held securely in place in the window 30 and are adapted to be aimed at a home entertainment device to be controlled, such as a television set. The LED's 1, 2 and 3 are coupled to an electrical circuit 36, shown in FIG'S. 2A and 2B, of the remote control 10.

FIG's. 2A and 2B show the schematic electrical circuit diagram of the electrical circuit 36 which is mounted in the remote control 10 and which includes a microprocessor 38, including a RAM and/or a ROM and/or an EEPROM and a CPU. The keypad 20 is coupled to the microprocessor 38 by a plurality of switch contact lines 44 connected to ports PA0 to PA7 of the microprocessor 38 and a plurality of switch contact lines 46 connected to ports PB0 to PB7 of the microprocessor 38.

The keypad 20 has input switch contact line cross-points 48 of lines 44 and 46 which are located beneath the keys 24 and which are coupled to the CPU via the lines 44 and 46 for remotely controlling a home entertainment device, such as a television set.

Figure 2A:
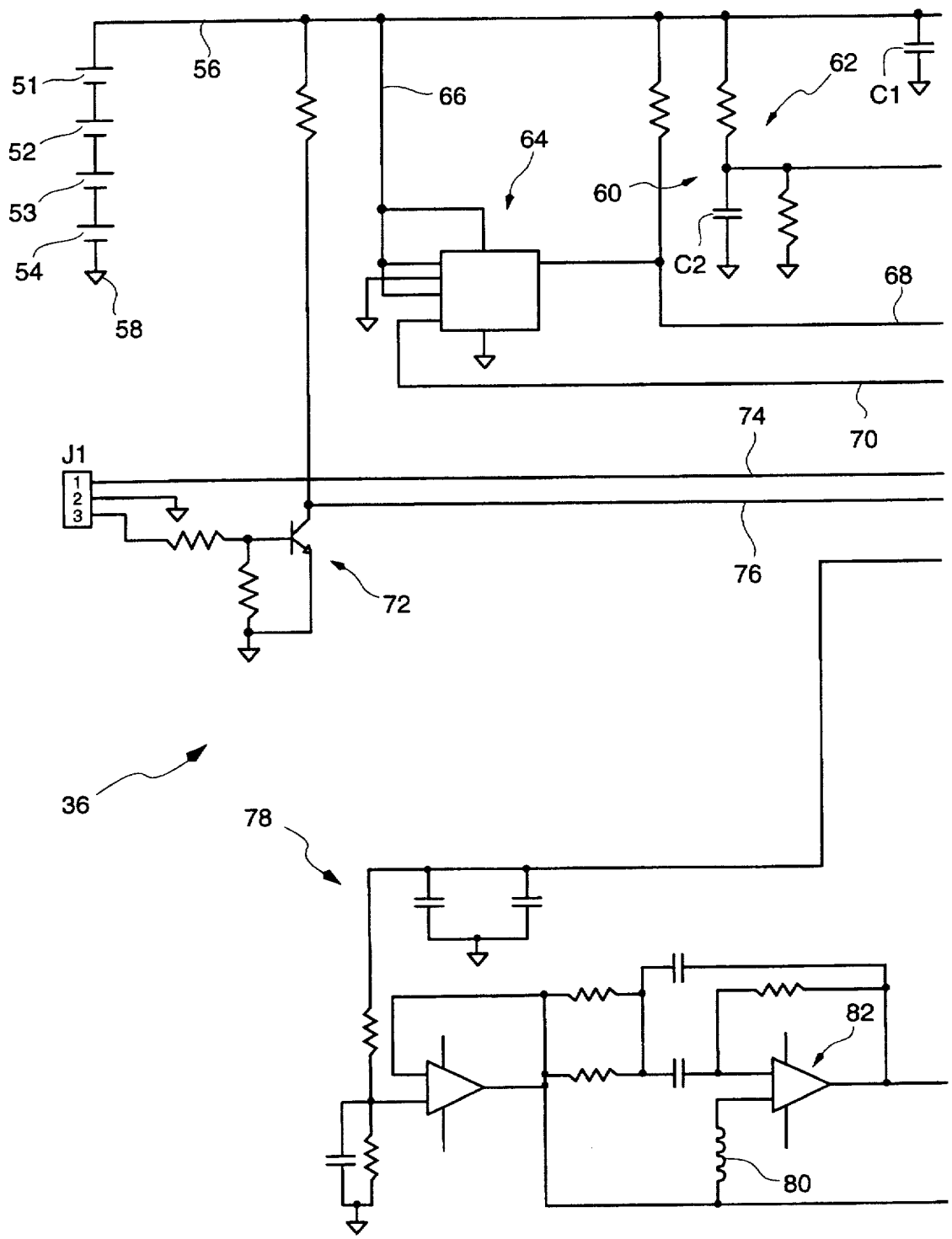
Figure 2B:
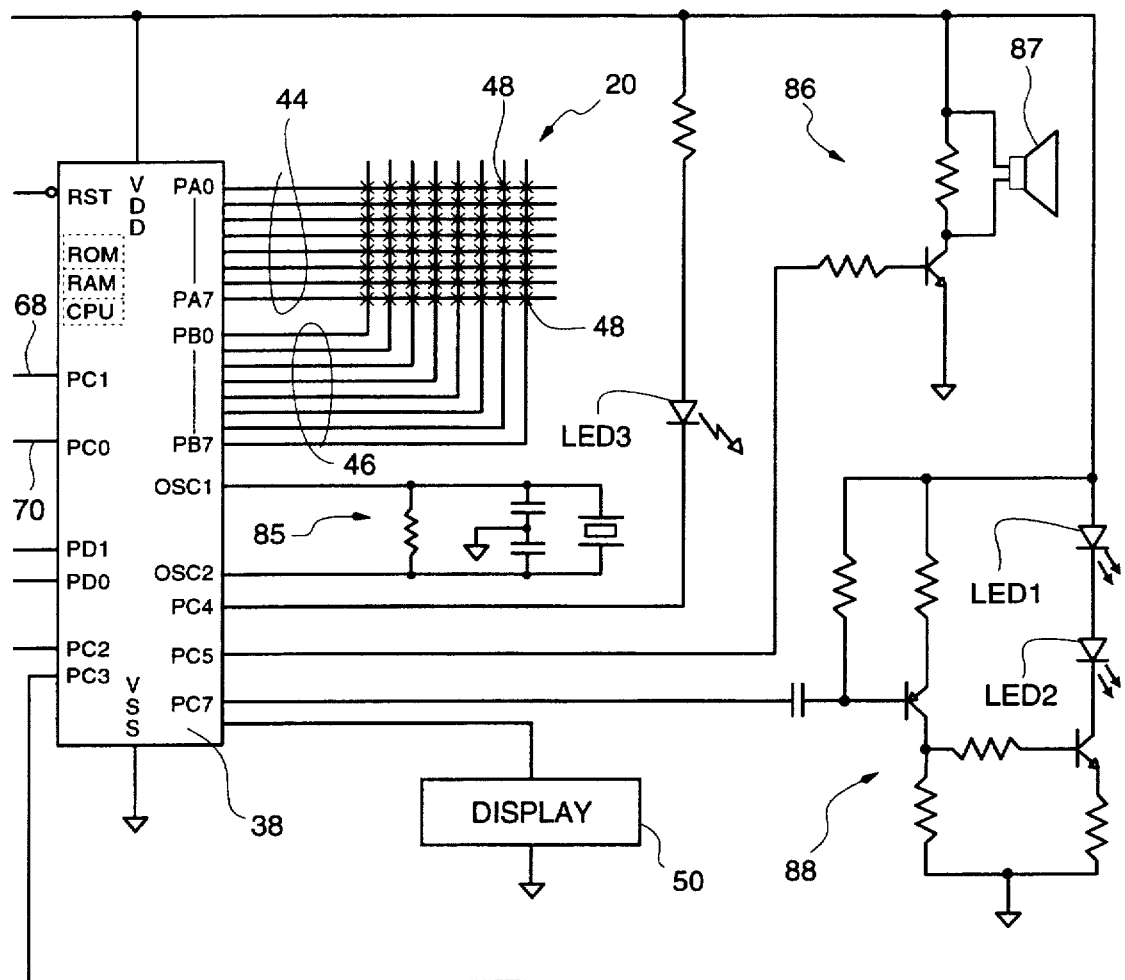
Figure 2B:
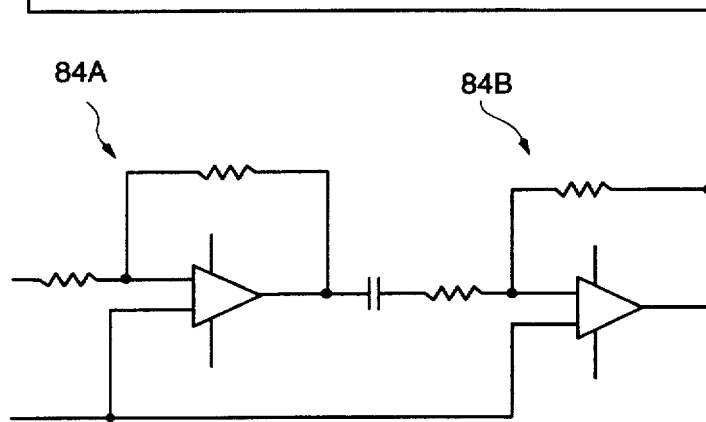

As shown in FIGS. 2A and 2B, each cross point 48 has a unique pair of input ports PA0–PA7 and PB0–PB7 to the CPU, to determine which key(s) 24 were pressed to execute a function associated with such key(s) 24.

A visual display 50 also can be provided connected as show in FIG. 2B and located on the upper surface 22 of the housing 12 of the remote control 10 as shown in FIG. 1.

A power supply in the form of four batteries 51–54 is connected between a + voltage buss 56 to the microprocessor 38 and a system ground 58.

Coupled to a reset input RST of the CPU is a reset circuit 60 including a voltage divider 62 for causing the CPU to reset and re-initialize itself when battery power is applied.

Capacitors C1 and C2 provide power supply filtering for the positive voltage buss 56.

An EEPROM 64 is energized via a line 66 connected to the buss 56 and is connected via lines 68 and 70 to ports PC1 and PC0 of the microprocessor 38.

A serial port J1 having three terminals 1,2 and 3 and including a transistor circuit 72 is coupled via lines 74 and 76 to ports PD1 and PD0 of the microprocessor 38.

According to the teachings of the present invention a signal coupling circuit or modem circuit 78 comprising a signal coupling transducer in the form of a pick up coil 80, a band pass filter circuit 82 and a signal boosting amplifier circuit 84A and 84B is coupled to ports PC2 and PC3 of the microprocessor 38.

An oscillator circuit 85 provides a clock frequency for the CPU and is coupled to ports OSC1 and OSC2 of the microprocessor 38.

One CPU output port PC4 is connected to LED 3 as shown.

The CPU also includes an output port PC5 connected to a buzzer or tone generating circuit 86 including a buzzer 87 as shown.

The CPU further includes an output port PC7 connected to lamp driver circuitry 88 as shown for driving LED 1 and LED 2.

According to the teachings of the present invention the remote control 10 has the pick up coil 80 for picking up electro-magnetic signals containing function code data (i.e., data for creating IR output signals which can be transmitted to a device, e.g., a television set, for causing it to perform a desired function) from a telephone handset or other electromagnetic wave emitter or transmitter.

It is to be noted that the electrical circuit 36 is generally of the type disclosed in greater detail in the Darbee et al U.S. Pat. No. 4,959,810, of which this application is a continuation-in-part and the disclosure of which is incorporated herein by reference.

The operating program for the remote control 10, which is stored in the ROM or RAM, is very similar to the operating program disclosed in the Darbee et al U.S. Pat. No. 4,959,810 which is incorporated herein by reference.

In FIG. 3 there is illustrated therein, in simplified form, a functional equivalent block diagram, showing Digital Signal Processing (DSP) which is software that acts like hardware. Traditionally hardware and software serve distinctly different functions. In a modem, for example, hardware (analog circuits) normally are responsible for taking a phone signal, filtering it, demodulating it, turning it into data bits of '1's and '0's.

Modem Receiver DSP Description

Traditional modem designs use circuits that convert telephone signals into computer data. Instead, the modem of the present invention uses Digital Signal Processing, a technique of replacing physical circuitry with computer software. The benefit is greatly reduced cost, and far more reliable performance. Digital Signal Processing implements the equivalent functions of physical circuitry by using a mathematically and logically equivalent algorithm in software.

The modulation scheme used by the modem receiver is Phase Shift Keying (PSK). PSK data is sent using a continuous carrier frequency. In our case, the carrier is a 2400 Hz signal. This signal is modulated by the data such that when the data is a '1', the signal is sent with a phase of 0 degrees. When the data is a 0, the signal is sent with a phase of 180 degrees. The data rate is 300 bits per second. That means that each bit of data is represented with 8 cycles of the 2400 Hz carrier.

The data that the modem must decode is a stream of bytes, which is made up of a stream of bits, which is made up with a stream of carrier cycles. In order to convert the received signal into a stream of bytes, the modem must synchronize to the carrier in order to synchronize to the bits in order to synchronize to the bytes. The modem does these synchronization levels simultaneously using a special sync signal that occurs at the beginning of each transmission.

2400 Hz Carrier

The frequency of the carrier never changes, it is always 2400 Hz. The amplitude doesn't change either, it stays constant. The only thing that does change is the phase, it changes between 0 and 180 degrees.

As stated above, the modem must synchronize to the carrier phase, the bit timing, and the byte timing. After synchronization has occurred, the signal must be converted into digital data. The electrical equivalent function block diagram containing a Costas Loop section 100, a Bit Sync (Tracking/ Data Extraction) section 102, and a Bit Shift Register section 104 shown in FIG. 3 illustrate the implementation of these synchronizing and data extraction functions.

The Costas Loop section 102 synchronizes to the carrier phase and outputs a positive signal for a '1' bit, or a negative signal for a '0' bit. The Costas Loop is a special phase lock loop that senses 180 degree phase shifts. It can synchronize to a carrier signal even though that signal may be buried in noise. Once the signal is synchronized and the 180 degree phase ambiguity of the signal is resolved, its output can be used for data extraction, and bit and byte synchronization.

Bit synchronization and data extraction are done by the Bit Sync section 102. It uses three sample and hold filter circuits 106, 108 and 110 (which are effectively integrate and dump filters due to the Costas Loop) to determine the start and slop timing of the bits. The magnitude of the value captured by the sample and hold filters 106, 108, 110 indicates how well synchronized that filter is to the bit timing. If the Lead Sample and Hold 106 has a larger magnitude than the Center Sample and Hold 108, the bit timing clock needs to advance. If the Lag Sample and Hold 110 has a larger magnitude than Center Sample and Hold 108, the bit timing clock needs to retard. When bit sync has been acquired, Center (108) Sample and Hold's magnitude will be the greatest.

Byte synchronization is done by the Bit Shift Register section 104. The synchronization signal that is sent at the beginning of every transmission has a unique pattern to indicate to the Shift Register Block when it is on byte boundaries. Once byte synchronization is complete, data is ready for use by the rest of the remote control 10 and typically is stored in the RAM.

There are two fundamental parts in the modem system for a remote control 10 constructed according to the teachings of the present invention. They are (a) a remote control 10 with a low cost modem, and (b) a call in station. The call in station is a PC with a special adapter card that allows the following functions:

1. Answer the phone.
2. Play recorded speech.
3. Respond to customer key presses on their touch tone phone.
4. Response to load requests from the remote.
5. Download error corrected IR codes.
6. Call an operator if the customer needs help.
7. Record customer voice responses.

Each remote control 10 will have the following attributes:

1. A magnetically coupled pickup coil to receive data.
2. A low cost amplifier to boost the signal level from the pickup coil.
3. A DSP/PSK receive modem coded in software in the CPU of the remote control.
4. An optional buzzer for a modem transmitter (like buzzers currently used on some remote controls).
5. Enough buffer RAM or EEPROM to store multiple appliance manufacturer's IDs (enough to cover all the IDs needed by the customer).

The key to the low cost of the modem is the use of Digital Signal Processing. This technology allows the remote control's CPU to absorb in software the analog circuit functions that normally exist in hardware. Since there is no additional cost for the software, most of the modem functions are free. The only external hardware needed is a loop of wire and a signal boosting amplifier.

The modem circuit 78 includes just that, namely, the pickup coil 80, the band pass filter circuit 82, and the signal boosting amplifier circuit 84A and 84B shown in FIG'S. 2A and 2B.

The pickup coil 80 can be a 200 turn coil for pickup of the electro-magnetic signal that generates the sound from a telephone's speaker or other electro-magnetic wave emitter or transmitter. It costs much less than a microphone and is much less susceptible to outside interference. It is also less expensive than cables, transformers, and connectors needed for direct connect to a telephone line or other electro-magnetic wave emitter or transmitter.

Following the pickup coil 80 is the band pass filter 82. This filter 82 removes unwanted interference and boosts the weak signal received by the pickup coil.

Following the filter 82 is a two stage amplifier 84A and 84B. It boosts the signal to a point where the second stage swings from rail to rail. The output of the second stage is fed directly into the remote control's CPU.

A LM324 Quad opamp is used for the band pass filter and amplifier circuits 84A and 84B. It is inexpensive and will work down to 2.5 volts on a single supply. It is also capable of directly driving logic circuitry. This makes it ideal for both 4 battery and 2 battery remote controls.

The (optional) transmitting part of the modem circuit 78 is the buzzer circuit 86 that is already included in some remote controls.

The buzzer 87 will send ACKs, NACKs and other data using long tone sequences. Since the buzzer 87 is not loud, and since it may be optimally placed for telephone use, long tone sequence (large fractions of a second) can be used to allow the receiving call in station's filters to retrieve the signal out of the noise.

Data Stream Format

A8 A8 ... A8 A8 Byte Count Data Bytes Check Sum 16

The call in station will send PSK data to the remote control 10 using a 2400 Hz carrier. All bytes are sent with start bits. The value of a start bit is the logical inverse of bit 0 of the byte to be sent. This insures that there is enough transitions in the data stream to guarantee bit synchronization. Bytes are sent bit 0 first, bit 7 last. The sync byte is an $A8 ($ standing for hexadecimal format of data). This value allows enough transitions for bit sync, is unique when shifted bit by bit through a shift register for frame sync, and allows the 180° phase ambiguity (ones being zeros and zeros being ones) to be resolved. A minimum of 4 sync bytes are sent. The byte count is sent, followed by the data bytes, followed by a 16 bit check sum. The byte count includes itself, all of the data bytes, and the checksum bytes. The checksum is the negated value of the sum of the byte count and the data bytes, MSB first.

Remote controls 10 with a buzzer 87 are able to send back status information on the success of each packet received. A 1500 Hz tone for ½s seconds can be used to indicate an ACK. The remote control 10 sends a 1000 Hz tone for ½s seconds or no tone at all for a NACK. The average data packet is 32 bytes and takes 1.2 seconds to transmit.

Following a data packet is a 50 ms pause for the remote control 10 to store the data and for the PSK transmitter to fill its buffer for another transmission.

1500 Hz Tone Byte Count Data Bytes CheckSum 16

The remote control 10 sends FM data to the call in station using a 1000 Hz carrier for zeros and a 1500 Hz carrier for ones. The data format is for the RS232 format, one start bit, 8 data bits, 1 stop bit, and no parity. The data rate can be 25 baud. The 1500 Hz Tone will be present for 250 ms. The byte count, data bytes, and the checksum will follow. The byte count is the sum of all of the data bytes and the checksum bytes. The checksum is the negated value of the sum of the byte count and the data bytes. Remote controls 10 that need to send data to the call in station will use this protocol. Remote controls 10 that don't, won't include this function.

Minimum Packet Protocol

Below is described the minimum form of packet protocol. This protocol is designed for remote controls 10 that are very cost sensitive and do not even have a buzzer 87 to send back status information. In the minimum packet protocol, there are four packet types that are used. At least 50 ms must be allowed for between the return from 'Demod' and the next call to 'Demod'.

1. Sync and Wait Packet This packet contains a lot of $A8 sync bytes. The length of the data in that packet is 3, no data bytes, and a 2 byte checksum. This is used to keep the remote control listening for data. This packet can be repeated multiple times to keep the remote control 10 listening.

2. Data Beginning Packet This packet has $A8 sync bytes followed by a variable length key that indicates that the next packets will have data. The length of the data in that packet is variable. The first byte of data is the Data Format Version number. This number identifies the way data is formatted (for future compatibility). The second byte of data identifies the remote control ID that the data is intended for. The 2 byte checksum follows last. A Data Beginning Packet must have at least one data byte.

3. Data Packets These packets are the data of the IDs and EXECs. The modem software needs no knowledge of the format.

Robust Packet Protocol

This protocol is used with remote controls 10 that have a buzzer 87 and can take advantage of expanded automatic functions of the call in station.

Digital Signal Processing Design

The call in station will send data using the Phase Shift Keying method. This method is used since it requires little from external hardware, has signal to noise performance that exceeds AM, FM, Trellis, DTMF, and others. It is easy to transmit, but the receiver is complicated.

Phase Shift Keying sends data by shifting the phase of the carrier 180°. If a one bit is determined to be a 0° phase carrier, then a zero bit is a 180° carrier. The receiver needs to be phased locked to the carrier. In addition, when the carrier changes phase, the phase locked loop must not need to reacquire phase lock. It must be able to lock to 0° as well as to 180° simultaneously.

A Costas Loop is a circuit designed to do this job and such a Costas Loop section 100 is illustrated in FIG. 3.

Costas Loop Description

The Basic Function of a Costas Loop

A Costas Loop is a phase lock loop that can lock to a signal at the 0 degree phase and the 180 degree phase. When locked, the Costas Loop has an output that specifies whether the signal it is locked to is 0 degrees or 180 degrees out of phase with respect to the loop's own VCO. This output is used for data recovery for signals that send data using 0 and 180 degree phase changes. See the waveforms illustrated in FIG. 4.

Inphase and Quadrature Signals

In order to understand how a Costas Loop synchronizes, it is important to understand how inphase and quadrature signals can be used.

When two inphase sine waves are multiplied together, a product signal is produced that has only positive values. This product signal is filtered so that only a 'D.C.' signal results that is proportional to the amplitude of the product signal. This is illustrated in FIG. 5.

When two sine waves whose phase differ by 180 degrees are multiplied together, a product signal results that has only negative values. This product signal is filtered so that only a 'D.C.' signal results that is proportional to the amplitude of the product signal. This is illustrated in FIG. 6.

When two sine saves whose phase differ by +90 degrees or −90 degrees exist, they are said to have a quadrature relationship. When these waves are multiplied together, a product signal results that has both positive and negative values. When this product signal is low pass filtered, the result is a zero voltage 'null' signal. This is illustrated in FIG. 7.

In general, when sine waves of various phase differences are multiplied and filtered, a D.C. output results whose amplitude is related to the phase difference. The phase difference is illustrated in FIG. 8.

Costas Loop Phase Locking

FIG. 9 shows the Costas Loop. The Costas Loop is a double sided phase lock loop. The top side (inphase side) processes signals that have phase differences of 0 and 180 degrees, when locked. The bottom side (quadrature side) processes signals that have phase differences of 90 and 270 degrees. In the middle is the loop filter and VCO which track the phase of the input signal.

Signal lock is acquired and maintained by using the phase relationships between the VCO's 0 and 90 degree outputs, and the input signal. When locked, the 0 degree output will be either 0 or 180 degrees away from the phase of the input signal. The VCO's 90 degree output will be 90 or 270 degrees away from the phase of the input signal. This means that the inphase side of the Costas Loop will have maximum amplitude voltage swings, and quadrature side will have no (or minimal) voltage swings.

If the VCO's 0 degree output is inphase with the input signal and the VCO's phase begins to lag behind the phase of the input signal's, the inphase side's positive amplitude begins to fall and the quadrature side's amplitude begins to go positive. The output of the inphase filter which is positive is multiplied by the quadrature filter's positive output, filtered, and fed to the VCO to cause the VCO to catch up to the input signal.

If the VCO's degree output is 180 degrees out of phase with the input signal and the VCO's phase begins to lag behind the phase of the input signal's, the inphase side's negative amplitude begins to fall and the quadrature side's amplitude begins to go negative. The output of the inphase filter which is negative is multiplied by the quadrature filter's negative output, filtered, and fed to the VCO to cause the VCO to catch up to the input signal.

If the VCO's 0 degree output is inphase with the input signal and the VCO's phase begins to lead the phase of the input signal's, the inphase side's positive amplitude begins to fall and the quadrature side's amplitude beings to go negative. The output of the inphase filter which is positive is multiplied by the quadrature filter's negative output, filtered, and fed to the VCO to cause the VCO to fall back to the input signal.

If the VCO's 0 degree output is 180 degrees out of phase with the input signal and the VCO's phase begins to lead the phase of the input signal's, the inphase side's negative amplitude begins to fall and the quadrature side's amplitude beings to go positive. The output of the inphase filter which is negative is multiplied by the quadrature filter's positive output, filtered, and fed to the VCO to cause the VCO to fall back to the input signal.

The data output of the Costas Loop is the output of the inphase filter.

Synchronizing to the Costas Loop's Data Output

The output of the Costas Loop is an analog voltage whose sign indicates a 0 or 180 degree phase relation. The exact beginning and end of the data bits isn't known yet, and needs to be determined. The Bit Sync diagram in FIG. 10 shows the signal processing arrangement.

There are three integrate and dump filters for detecting data bit alignment. These filters are designed to integrate the output of the Costas Loop for one bit period. The Center Integrate and Dump Filter, when bit synchronized, will begin integrating the signal at the beginning of the data bit until the end of the data bit, exactly. The Lead Integrate and Dump Filter will begin integrating the signal before the beginning of the data bit until just before the end of the data bit. The Lag Integrate and Dump Filter will begin integrating the signal just after the beginning of the data bit until just after the end of the data bit. The result is that the Center filter will integrate a signal that is completely positive or negative, and the Lead and Lag Filters will integrate a signal that has both positive and negative components. This means that the absolute value of the Center Filter will be greater than the Lead and Lag Filters when bit synchronization is achieved. If the Bit Clock begins to fall behind the data, the Lag Filter's output amplitude will increase and the Center Filter's output amplitude will decrease. When the Center Filter's amplitude falls below the Lag Filter's amplitude, the bit clock is advanced to regain synchronization. If the Bit Clock begins to lead the data, the Lead Filter's output amplitude will begin to increase and the Center Filter's amplitude will begin to decrease. When the Center Filter's amplitude falls below the amplitude of the Lead Filter, the Bit Clock is retarded to regain synchronization.

The Absolute Magnitude Comparator is responsible for determining which filter is best synchronized to the data stream, by virtue of each filter's integration value. In the way explained above, the Absolute Magnitude Comparator will cause the Bit Clock to advance in time or retard in time in order to establish and maintain bit synchronization.

The Bit Clock is a timer that can be advanced or retarded in time. It controls the timing for the Integrate and Dump Filters, and provides a clock signal that indicates when bits are available.

Bit synchronization can only be established and maintained when there are sufficient number of data bit transitions. Therefore, the data stream must be designed to have a minimum number of transitions. The Modem guaranties at least one transition per byte of data.

The modem is a variant of this design concept. In order to reduce computational overhead, the Bit Sync sub system shares an integrator with the Costas Loop's Inphase Filter. This allows the Integrate and Dump Filters to be replaced with Sample and Hold Filters, and yet the same result is achieved.

Synchronizing to Data Bytes

The stream of data bits needs to be parsed into data bytes. In order to be able to determine where bytes begin and end, a special bit pattern is needed. This bit pattern is 10001010. This pattern is used for three reasons; it has enough transitions for bit sync to synchronize, the pattern is detectable if it is complemented (01110101), it remains unique while it is shifted and compared to. FIG. 11 shows the functional block diagram.

The Bit Clock causes Bit Data to be shifted into the Shift Register. As each shift occurs, the 8 bit value of the Shift Register is compared to the Sync Pattern. If the Sync Pattern equals the value in the Shift Register, then byte synchronization has been achieved and the Bit Counter is reset to be synchronized to the beginning of each byte. The Bit Counter will output a clock signal at the beginning of each byte to allow the value in the shift register to be read as a fully formed Data Byte. The Byte Sync Flag is set to indicate that byte synchronization has been achieved. If the Out of Phase Pattern is detected, the Costas Loop has synchronized 180 degrees out of phase and is then commanded to advance 180 degrees to acquire the correct synchronization.

Call In Station Design Details

Call In Station Design Overview.

The call in station will be made up of a PC and a head phone. The PC will be the central controller for the telephone line, and will be capable of doing all operations without a human operator. A human operator can be called by the customer by pressing a key on their touch tone phone.

The capabilities of the remote controls 10 will vary. Some remote controls 10 will be able to dial, down load new IDs and EXECs, and send back status information to the call in station; while other remote controls 10 will be dependent on customer intervention. The call in station has to be flexible enough to handle all of these situations.

Call In Station Hardware Interface

A card containing all of the call in station's PC to telephone line circuitry plugs into a 16 bit slot inside a PC. The software interface is as follows:

Input Port $300 (Call Process Tone Detector)

Bit 0 : 1=350 Hz signal present on phone line

Bit 1 : 1=620 Hz signal present on phone line

Bit 2 : 1=440 Hz signal present on phone line

Bit 3 : 1=480 Hz signal present on phone line

By monitoring which bits are set and the duty cycle of the bits, the status of the call in progress can be determined. (See the data sheet provided for the M-982 Precise Call Progress Tone Detector from TeleTone for more information.)

Input Port $304 (DTMF Receiver & Ring/On Hook Indicator)

Bit 0–Bit 3 : DTMF receive code

Bit 6 : DTMF Data Valid signal

Bit 7 : Solid 0=Off Hook, Pulsed=Ringing

Bits 0–3 will contain a valid decoded duel tone pair when Bit 6 is high.

Bit 7 is low when the phone is taken off hook, and is pulsed slowly when the phone is ringing when the phone is on hook. See the data sheet provided for the 2090 DTMF Transceiver from Silicon Systems for more information.

Output Port $308 (DTMF Transmitter)

Bit 0–Bit 3 : DTMF transmitter code

When any code is written to the DTMF transmitter, the transmitter will start generating the tone duel for that code. The tone is changed by writing a new code. The tone is stopped by resetting the DTMF transceiver (see below).

Output Port $30C

Bit 0 : 1=Off Hook, 0=On Hook

Bit 1 : 1=Reset DTMF Transceiver, 0=DTMF Transceiver active.

From the foregoing description, it will be apparent that the remote control 10, with the pickup coil 80 and the Costas Loop software stored in the RAM or EEPROM 64 of the microprocessor 38 of the remote control 10 of the present invention, has a number of advantages, some of which have been described above and others of which are inherent in the invention. Also, it will be understood that modifications be made to the remote control 10 without departing from the teachings of the invention. Accordingly, the scope of the invention is only to be limited as necessitated by the accompanying claims.

We claim:

1. A remote control comprising:

a microprocessor including a CPU and memory means;

a keypad including keys for operating said remote control coupled to said microprocessor;

signal outputting circuitry;

driver circuitry coupled to said microprocessor for driving said signal outputting circuitry;

hardware and software, including said microprocessor, for generating output signal data which is supplied to said driver circuitry;

a coupling transducer in said remote control for picking up magnetic signals from a device capable of emitting or transmitting magnetic signals;

coupling circuitry for coupling said coupling transducer to said microprocessor; and, decoding means including one or both of decoding hardware or decoding software coupled to or received in said microprocessor for decoding the magnetic signals picked up into bits and/or bytes of output signal data; and, means for storing said bits and/or bytes in said memory means.

2. The remote control of claim 1 wherein said decoding hardware or software includes a band pass filter section.

3. The remote control of claim 1 wherein said decoding hardware or software includes a signal boosting amplifier section.

4. The remote control of claim 1 wherein said decoding software includes a Costas Loop section.

5. The remote control of claim 4 wherein said decoding software includes a bit sync tracking/data extractor section which is coupled to or supplied to said Costas Loop section.

6. The remote control of claim 5 wherein said decoding software includes a bit shift register section which is coupled to or supplied to said bit sync tracking/data extractor section.

7. The remote control of claim 1 including a visual display.

8. The remote control of claim 1 wherein said memory means of said remote control includes an EEPROM for storing data that is picked up by said coupling transducer.

9. The remote control of claim 1 wherein said remote control further includes a buzzer or code generating circuit which includes a buzzer, which is coupled to said CPU and which is operable to generate tone signals for communicating through a telephone handset and over a telephone line with a host computer.

10. The remote control of claim 1 wherein said coupling transducer is coupled into a band pass filter circuit forming at least part of said hardware the output of which is coupled to a signal boosting amplifier circuit also forming part of said hardware and having an output coupled to said CPU.

11. The remote control of claim 1 wherein said coupling transducer is a pick-up coil.

12. The remote control of claim 1 wherein said electro-magnetic signal emitting or transmitting device is a telephone handset.

13. The remote control of claim 1 further including indicating means for indicating when a data transmission has been completed.

14. The remote control of claim 13 wherein said indicating means include light emitting means.

15. A method for communicating instructions and/or function code data for operating a controlled consumer electrical appliance, such as a television set, from a host call-in station including a computer to a signal coupling system comprising an electro-magnetic signal coupling transducer in a remote control, said method comprising the steps of:

encoding function code data into bits forming bytes where each bit is defined by a predetermined number of cycles of a carrier frequency and the logic, 1 or 0, of the data bit is defined by an in-phase timing of the cycles, and the logic 0 or 1, is defined by a 180 degree out-of-phase timing of the cycles;

transmitting the carrier frequency to an electro-magnetic signal emitting device;

picking up with the signal coupling transducer the carrier frequency emitted from the electro-magnetic signal emitting device;

decoding the data bit logic contained in the carrier frequency with one of or both of decoding hardware in the remote control or decoding software stored in the memory of the remote control; and, storing the decoded function code data in memory of the remote control.

16. The method of claim 15 wherein the carrier is 2400 Hz.

17. The method of claim 15 wherein the predetermined number of cycles is 8.

18. The method of claim 15 wherein said decoding hardware or decoding software includes a band pass filter section.

19. The method of claim 15 wherein said decoding hardware or decoding software includes a signal boosting amplifier section.

20. The method of claim 15 wherein said decoding software includes a Costas Loop section.

21. The method of claim 20 wherein said decoding software includes a bit sync tracking/data extractor section which is coupled to or supplied to said Costas Loop section.

22. The method of claim 21 wherein said decoding software includes a bit shift register section which is coupled to or supplied to said bit sync tracking/data extractor section.

23. The method of claim 15 including the step of displaying on a visual display of the remote control messages relating to the transfer of data to the remote control memory.

24. The method of claim 15 wherein said memory means of said remote control includes an EEPROM for storing data that is picked up by said coupling transducer.

25. The method of claim 15 including the steps of: generating, with a buzzer or code generating circuit which includes a buzzer, a tone signal and communicating the tone signal through a telephone handset and over a telephone line to a host computer.

26. The method of claim 15 including the step of:

indicating to a user of the remote control when a data transmission to or from the remote control has been completed.

27. The method of claim 15 wherein said coupling transducer is a pick-up coil.

* * * * *